United States Patent [19]

Fevrier et al.

[11] Patent Number: 5,308,831
[45] Date of Patent: May 3, 1994

[54] METHOD OF MAKING A CONNECTION BETWEEN A HIGH CRITICAL TEMPERATURE SUPERCONDUCTIVE CERAMIC AND A SUPERCONDUCTOR BASED ON NIOBIUM-TITANIUM

[75] Inventors: Alain Fevrier, Paris; Albert Leriche, Gif sur Yvette; Peter Herrmann, Corbreuse, all of France

[73] Assignee: GEC Alsthom SA, Paris, France

[21] Appl. No.: 903,952

[22] Filed: Jun. 26, 1992

[30] Foreign Application Priority Data

Jun. 27, 1991 [FR] France ................. 91 07969

[51] Int. Cl.[5] ............ B23K 1/00; B23K 1/19; B23K 1/20
[52] U.S. Cl. .................. 505/100; 228/122.1; 228/124.1; 228/179.1; 29/599; 505/927; 505/706
[58] Field of Search ........... 228/122, 124, 263.12, 228/170, 179; 29/599, 868, 872; 505/1, 925, 927, 706

[56] References Cited

U.S. PATENT DOCUMENTS

| | | | |
|---|---|---|---|
| 3,737,989 | 6/1973 | Schaetti | 505/927 |
| 4,902,995 | 2/1990 | Vermilyea | 505/1 |
| 5,056,216 | 10/1991 | Madou et al. | 228/180.2 |
| 5,061,680 | 10/1991 | Paulson et al. | 505/1 |
| 5,104,745 | 4/1992 | Cave et al. | 428/607 |
| 5,120,252 | 6/1992 | Mayo et al. | 228/180.1 |
| 5,140,006 | 8/1992 | Woolf | 427/117 |
| 5,147,849 | 9/1992 | Tanaka et al. | 505/1 |
| 5,148,262 | 9/1992 | Ahonen et al. | 505/1 |

FOREIGN PATENT DOCUMENTS

| | | | |
|---|---|---|---|
| 0406862 | 1/1991 | European Pat. Off. | 228/DIG. SC |
| 89174 | 4/1989 | Japan | 505/1 |
| 8908319 | 8/1989 | PCT Int'l Appl. | 228/DIG. SC |
| 2183110 | 5/1987 | United Kingdom | 228/DIG. SC |
| 2212983 | 8/1989 | United Kingdom | 228/DIG. SC |

OTHER PUBLICATIONS

Metals Handbook Ninth Edition, vol. 6, pp. 1077–1081, copyright 1983.
French International Search Report, Mar. 12, 1992, by Examiner Roussel.
IEEE Transactions on Magnetics, vol. 27, No. 2, Mar. 1991, pp. 1861–1869.
Patent Abstracts of Japan, vol. 13, No. 218, May 22, 1989 (JPA 030 187).

*Primary Examiner*—Samuel M. Heinrich
*Attorney, Agent, or Firm*—Sughrue, Mion, Zinn, Macpeak & Seas

[57] ABSTRACT

A method of connecting a high critical temperature superconductive ceramic part and a low critical temperature superconductor such as a multifilament strand of niobium-titanium, in which method a silver contact is prepared on said ceramic part, wherein said multifilament strand is soldered to said contact using an intermediate solder material whose melting temperature is less than 300° C.

2 Claims, 1 Drawing Sheet

METHOD OF MAKING A CONNECTION BETWEEN A HIGH CRITICAL TEMPERATURE SUPERCONDUCTIVE CERAMIC AND A SUPERCONDUCTOR BASED ON NIOBIUM-TITANIUM

The present invention relates to a method of making a mechanical and an electrical connection between a high critical temperature superconductive ceramic and a superconductor based on niobium-titanium, in particular for the purpose of making current leads.

BACKGROUND OF THE INVENTION

The use of superconductors or hyperconductors at very low temperature (e.g. 4.2° K., the temperature of liquid helium) requires current to be conveyed by current leads from a region at ambient temperature (300° K.) to the region at very low temperature.

In general, current leads are made using metal conductors, optionally cooled by the vapor of the cryogenic fluid. The resulting cryogenic load is considerable and it cannot be reduced below a certain limit because of the relationship that exists for metals between electrical conductivity and thermal conductivity (Wiedemann Franz law). Thus, a copper current lead operating between 4.2° K. and 300° K. and optimized for 1000 A, dissipates 1 W in the helium, and uses the resulting vapor for cooling purposes. This vapor represents a cooling and liquefying load of the order of 3 kW of electricity.

As soon as high critical temperature superconductive ceramics appeared (e.g. 93° K. for $YBa_2Cu_3O_{6.9}$), composite current leads were envisaged comprising a superconductor between the very low temperature (e.g. 4.2° K.) and an intermediate temperature (e.g. 77° K., the temperature of liquid nitrogen) together with a metal conductor between the intermediate temperature and ambient temperature.

A superconductive ceramic has the advantage of producing no heat by the joule effect under DC conditions and of producing very little under certain variable conditions. This advantage is associated with low thermal conductivity.

The article "YBaCuO current lead for liquid helium temperature applications" by F. Grivon et al., 1990 Applied Superconductivity Conference, Snowmass, Colo., 24 to 28 September 1990, describes an example of a current lead where a YBaCuO part is used in the form of a bar or a tube.

For example, it is possible to envisage using a ceramic bar having a section of 20 $mm^2$, a length of 10 cm, and transporting 1000 A. That would dissipate about 0.2 W in the helium, representing an electrical load of 100 W in a helium refrigerator. This load is in addition to the load represented by cooling the metal current speed between 77° K. and 300° K., which is about 400 W of electricity. Such a solution therefore appears highly advantageous compared with the above-mentioned metal current lead between 4.2° K. and 300° K.

Solid $HT_c$ superconductive ceramic bars have been assembled together as described in the article by J. L. Wu et al. and J. R. Hull et al. in the 1990 Applied Superconductivity Conference, Snowmass, Colo., 24 to 28 September 1990.

In prior publications, a solution has been found for making contact between YBaCuO superconducting ceramic and a copper conductor. Proposals are made in the article by F. Grivon et al. to use a brush to paint a suspension containing silver on the YBaCuO ceramic, which painted suspension is then dried and subsequently subjected to heat treatment at about 930° C. Low contact resistance is thus obtained, of the order of $10^{-13}\Omega m^2$. A silver-copper bond is then made.

To date, the problem of making a bond between YBaCuO ceramic and a conductor comprising multifilament superconductive strands based on niobium-titanium has not been solved. Under such circumstances, it is quite possible to envisage making a first copper-YBaCuO bond separately from a second copper-multifilament strand bond, with the copper parts then being soldered together (the copper may be replaced by any other suitable metal). Nevertheless, the presence of an intermediate part made of metal having resistance and extending between the YBaCuO ceramic and the superconductive strand will give rise to heat losses from the liquid helium.

An object of the present invention is to provide a connection method enabling losses to be reduced as much as possible, while nevertheless be simple to implement.

SUMMARY OF THE INVENTION

The present invention provides a method of connecting a high critical temperature superconductive ceramic part and a low critical temperature superconductor such as a multifilament strand of niobium-titanium, in which method a silver contact is prepared on said ceramic part, wherein said multifilament strand is soldered to said contact using an intermediate solder material whose melting temperature is less than 300° C.; for example, said intermediate solder material is selected from lead-tin alloys, alloys of silver or of cadmium, and Wood's metal.

These solder materials are used at temperatures that ensure that the superconductive strand is not damaged during the connection operation.

It is particularly advantageous to use Wood's metal since it is superconductive at 4.2° K.

In a first variant implementation, a hole is formed in one end of the ceramic part, a silver contact is made in said hole, and then the multifilament strand is inserted therein together with the solder material.

If the solder material is Wood's metal, it is advantageous to cut the strand on a slant so as to increase the contact area between the solder and the superconductive filaments of the strand. Contact resistance is then quite minimized.

In a second variant implementation, a silver contact is formed on a ring of the cylindrical or rectangular outside face of said ceramic part, and the multifilament strand is wound around said ring together with said intermediate solder material. Under such circumstances, the transfer length for current between the part and the strand is increased, and this gives rise overall to a lower contact resistance. In addition, operating on the outside surface of the part simplifies the procedure.

In both of the above variants, and particularly when the solder material is itself superconductive, it is advantageous to eliminate the matrix in which the superconductive filaments are embedded, e.g. by a chemical method. The superconductive solder is thus in direct contact with the filaments and this achieves a superconductor to superconductor bond. Contact resistance can then reach values of about $10^{-13}\Omega m^2$.

Naturally, when the superconductor comprises a plurality of assembled-together strands, the method of the invention is applied to each of them, regardless of which variant implementation is used.

BRIEF DESCRIPTION OF THE DRAWING

Embodiments of the invention are described by way of example with reference to the accompanying drawing, in which.

DETAILED DESCRIPTION

Figure 1:
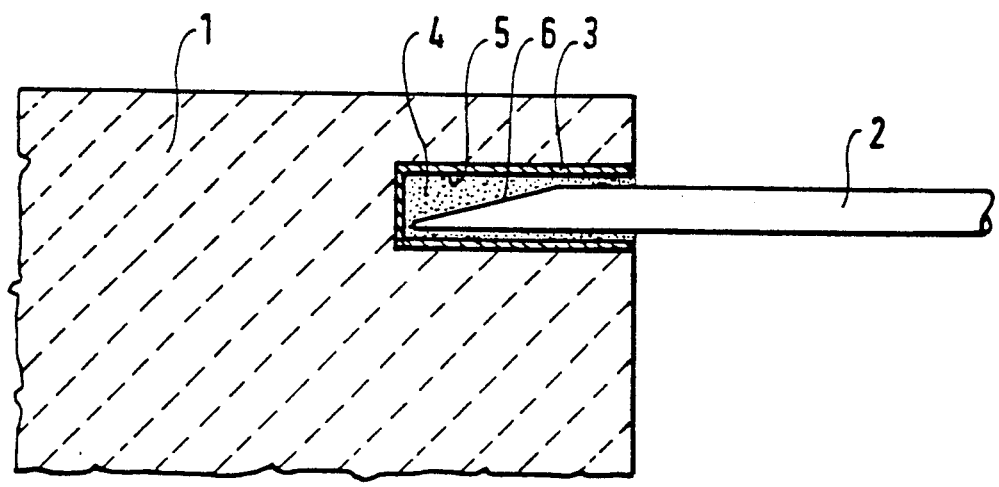
FIG. 1 is a diagrammatic fragmentary section view through a ceramic part including a connection of the invention.

FIG. 1 shows the end of a YBaCuO type superconductive ceramic part situated in a medium at very low temperature (4.2° K.) and having a hole 5. The walls of the hole have a silver contact 3 formed thereon, preferably in the manner described in the above-mentioned publication of F. Grivon et al.

A strand 2 comprising a plurality of superconductive filaments of niobium-titanium embedded in a matrix of cupro-nickel alloy is inserted into the hole 5 prepared in this way. The end 6 of said strand is previously cut at a slant. Soldering is performed using Wood's metal, given reference 4.

Figure 2:
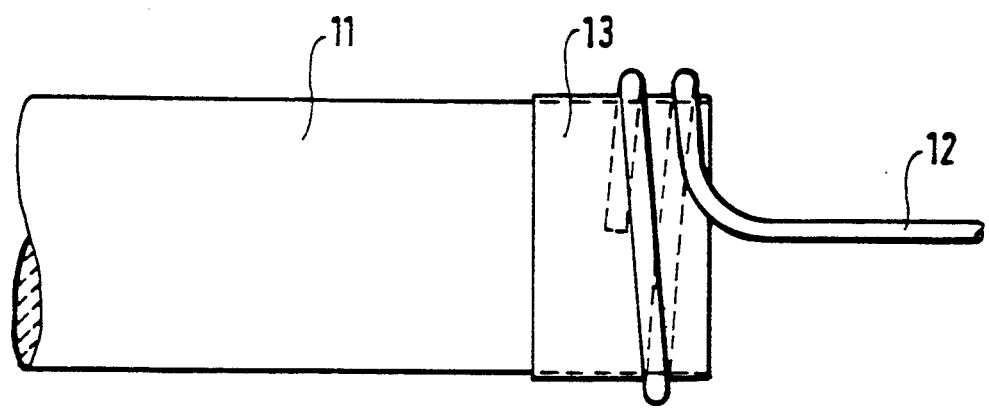
FIG. 2 is a fragmentary diagrammatic elevation view of a ceramic part with a variant connection of the invention.

In FIG. 2, the silver contact 13 on the outside face of a ceramic bar 11 of YBaCuO is in the form of a ring. The superconductive strand 12 is wound around the ring and is soldered thereto by a solder material, such as a silver-based alloy whose soldering temperature is less than 300° C.

Naturally, the invention is not limited to the implementations described above. In particular, any means could be replaced by equivalent means without going beyond the ambit of the invention.

We claim:

1. A method of connecting a high critical temperature superconductive ceramic part and a low critical temperature superconductor strand of niobium-titanium, said method comprising preparing a silver contact on said ceramic part as a ring on the outer surface of said ceramic part, soldering one end of said strand to said silver contact using an intermediate soldering material chosen from the group consisting of lead-tin alloys, silver alloys, cadmium alloys and WOOD's metal 2. A method of connecting a high critical temperature superconductive ceramic part and a low critical temperature superconductor constituting a multi-filament strand made of niobium titanium, said method comprising:

forming a silver lining contact in a hole in said ceramic part, cutting one end of said strand obliquely and inserting said cut end of said strand in said hole, and soldering said inserted cut end of said strand to said silver contact using WOOD's metal.

* * * * *